(12) United States Patent
Duncan et al.

(10) Patent No.: US 12,389,562 B2
(45) Date of Patent: Aug. 12, 2025

(54) FLOOR TRACK AND MOUNTING APPARATUS FOR MODULAR DATA CENTERS

(71) Applicant: Dell Products L.P., Round Rock, TX (US)

(72) Inventors: Tyler Baxter Duncan, Austin, TX (US); Anthony Middleton, Cedar Park, TX (US); Ty Robert Schmitt, Round Rock, TX (US); Jeffery Todd Sayles, San Marcos, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 450 days.

(21) Appl. No.: 17/970,369

(22) Filed: Oct. 20, 2022

(65) Prior Publication Data
US 2024/0138086 A1  Apr. 25, 2024
US 2024/0237262 A9  Jul. 11, 2024

(51) Int. Cl.
| | |
|---|---|
| *G06F 1/16* | (2006.01) |
| *H05K 5/00* | (2025.01) |
| *H05K 7/00* | (2006.01) |
| *H05K 7/14* | (2006.01) |
| *H05K 7/20* | (2006.01) |

(52) U.S. Cl.
CPC ......... *H05K 7/1495* (2013.01); *H05K 7/1431* (2013.01); *H05K 7/1497* (2013.01); *H05K 7/202* (2013.01); *H05K 7/20836* (2013.01)

(58) Field of Classification Search
CPC .. H05K 7/1495; H05K 7/1431; H05K 7/1497; H05K 7/202; H05K 7/20836
See application file for complete search history.

(56) References Cited

U.S. PATENT DOCUMENTS

| | | |
|---|---|---|
| 5,210,680 A | 5/1993 | Scheibler |
| 6,164,369 A | 12/2000 | Stoller |
| 6,353,529 B1 | 3/2002 | Cies |
| 6,442,030 B1 | 8/2002 | Mammoser |
| 6,688,711 B1 | 2/2004 | Mease |
| 6,873,883 B2 | 3/2005 | Ziarnik |
| 7,016,191 B2 | 3/2006 | Miyamoto |
| 7,026,551 B2 | 4/2006 | Franz |
| 7,054,155 B1 | 5/2006 | Mease et al. |
| 7,142,425 B2 | 11/2006 | Tomioka |
| 7,189,924 B1 | 3/2007 | Popescu |
| 7,385,810 B2 | 6/2008 | Chu |
| 7,580,259 B2 | 8/2009 | Hsiao |
| 7,660,117 B2 | 2/2010 | Werner |
| 7,679,909 B2 | 3/2010 | Spearing |
| 7,813,121 B2 | 10/2010 | Bisson |
| 7,916,471 B2 | 3/2011 | Miyamoto |
| 8,077,462 B2 | 12/2011 | Barringer |
| 8,164,897 B2 | 4/2012 | Graybill |
| 8,199,485 B2 | 6/2012 | Cheng |

(Continued)

*Primary Examiner* — Anthony M Haughton
(74) *Attorney, Agent, or Firm* — Chamberlain Hrdlicka; Aly Z. Dossa (57) ABSTRACT

A modular information technology component includes: an information handling system; a floor, in which the floor includes a floor track apparatus and the information handling system is located on the floor; and a rack mounting component, in which the rack mounting component affixes the information handling system to the floor track apparatus.

20 Claims, 7 Drawing Sheets

(56) References Cited

U.S. PATENT DOCUMENTS

| | | |
|---|---|---|
| 9,042,099 B2 | 5/2015 | Campbell |
| 9,585,282 B1 | 2/2017 | Gandhi |
| 10,292,313 B2 | 5/2019 | Magallanes |
| 10,802,556 B2 | 10/2020 | North |
| 2003/0026084 A1 | 2/2003 | Lauchner |
| 2004/0042175 A1 | 3/2004 | Kehret |
| 2004/0182798 A1 | 9/2004 | Williams |
| 2007/0045479 A1 | 3/2007 | Nguyen |
| 2007/0230123 A1 | 10/2007 | Hata |
| 2008/0060790 A1 | 3/2008 | Yates |
| 2008/0064317 A1 | 3/2008 | Yates |
| 2011/0094978 A1 | 4/2011 | Bailey |
| 2011/0315353 A1 | 12/2011 | Campbell |
| 2012/0119632 A1 | 5/2012 | Bousseton |
| 2012/0134104 A1 | 5/2012 | Driggers |
| 2012/0155027 A1 | 6/2012 | Broome |
| 2013/0032310 A1 | 2/2013 | Jaena et al. |
| 2013/0264026 A1 | 10/2013 | Eckberg |
| 2014/0319985 A1* | 10/2014 | Kikuchi ............. H05K 7/20736 312/317.1 |
| 2015/0105930 A1 | 4/2015 | Sparrowhawk |
| 2017/0268239 A1 | 9/2017 | Kobayashi |
| 2018/0092227 A1 | 3/2018 | Stewart |
| 2018/0213673 A1 | 7/2018 | Eckberg |
| 2018/0223541 A1 | 8/2018 | Kobayashi |
| 2021/0127523 A1* | 4/2021 | Bailey ................. H05K 7/1491 |
| 2022/0007547 A1 | 1/2022 | Farshchian |
| 2023/0117815 A1 | 4/2023 | Ruiz Holguin |
| 2024/0138085 A1 | 4/2024 | Duncan |
| 2024/0138086 A1 | 4/2024 | Duncan |
| 2024/0138088 A1 | 4/2024 | Duncan |
| 2024/0138089 A1 | 4/2024 | Duncan |
| 2024/0138122 A1 | 4/2024 | Duncan |

\* cited by examiner

FLOOR TRACK AND MOUNTING APPARATUS FOR MODULAR DATA CENTERS

BACKGROUND

The heterogeneous data center environments witnessed today often require a combination of various cooling, power, and information technology (IT) components. The cooling, power, and IT components are available either commercially with minimum configuration options (e.g., one-size-fits-all) or through a full custom solution for a specific customer demand. This either impacts scalability of the heterogeneous data center environments, or requires resource-intensive engineering for deployment of the cooling, power, and IT components.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 2.1 shows a top view of the system of FIG. 1 in accordance with one or more embodiments of the invention.

FIG. 2.2 shows a diagram of an information handling system (IHS) in accordance with one or more embodiments of the invention.

FIG. 2.3 shows a diagram of a computing device in accordance with one or more embodiments of the invention.

FIG. 3.1 shows a top view of a portion of the system of FIG. 1 in accordance with one or more embodiments of the invention.

FIG. 3.2 shows a side view of a portion of the system of FIG. 1 in accordance with one or more embodiments of the invention.

DETAILED DESCRIPTION

Specific embodiments of the invention will now be described in detail with reference to the accompanying figures. In the following detailed description of the embodiments of the invention, numerous specific details are set forth in order to provide a more thorough understanding of one or more embodiments of the invention. However, it will be apparent to one of ordinary skill in the art that one or more embodiments of the invention may be practiced without these specific details. In other instances, well-known features have not been described in detail to avoid unnecessarily complicating the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items, and does not require that the element include the same number of elements as any other item labeled as A to N. For example, a data structure may include a first element labeled as A and a second element labeled as N. This labeling convention means that the data structure may include any number of the elements. A second data structure, also labeled as A to N, may also include any number of elements. The number of elements of the first data structure, and the number of elements of the second data structure, may be the same or different.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct connection (e.g., wired directly between two devices or components) or indirect connection (e.g., wired and/or wireless connections between any number of devices or components connecting the operatively connected devices). Thus, any path through which information may travel may be considered an operative connection.

In general, before shipping a modular data center (MDC) to a customer site, IHSs are affixed (e.g., secured) to a floor located within the MDC for safety purposes. Once the IHSs are affixed to the floor, the MDC may then be shipped to the customer site. Typically, in order to secure a first type of IHSs to the floor, the floor includes a first type of mechanical connection components (e.g., a first type of mounting holes (MHs)) that are positioned at a first set of fixed locations along the floor. In order to secure a second type of IHSs to the floor, the floor needs to include a second type of MHs that are positioned at a second set of fixed locations along the floor. However, in order to secure both the first and second type of IHSs, the floor needs to be redesigned (e.g., modified) to accommodate both the first and second type of MHs, which requires resource (e.g., engineering, manufacturing, procurement, etc.) intensive efforts.

To address one or more of the aforementioned issues, embodiments of the invention provide a floor that can host different types of IHSs at the same time. More specifically, embodiments of the invention describe how to secure different types of IHSs to the floor using floor track apparatuses (FTAs). This advantageously provides a flexibility to secure different types of IHSs to the floor without redesigning the floor and without requiring the resource-intensive efforts.

The following describes various embodiments of the invention.

As used herein, an "MDC" includes any facility or a portion of a facility in which computing operations are carried out. An MDC may include IHSs and IHS components coupled together as functional IHSs, in which the IHSs and the functional IHSs are dedicated to serve specific functions or to serve multiple functions. Examples of computing operations may include (but not limited to): information processing, communications, testing, simulations, power distribution and control, operational control, etc.

Figure 1:
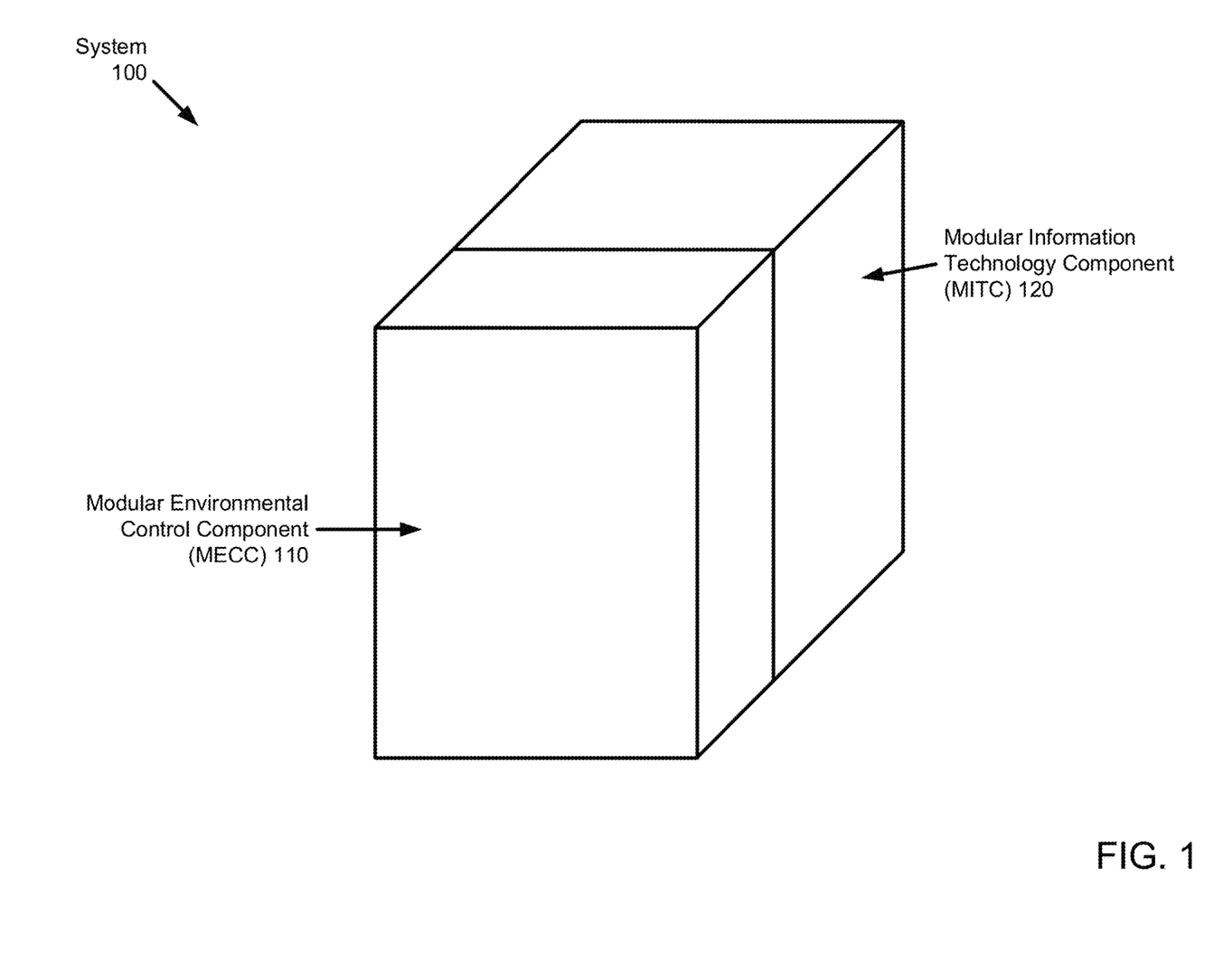
FIG. 1 shows a diagram of a system in accordance with one or more embodiments of the invention.
Figure 21:
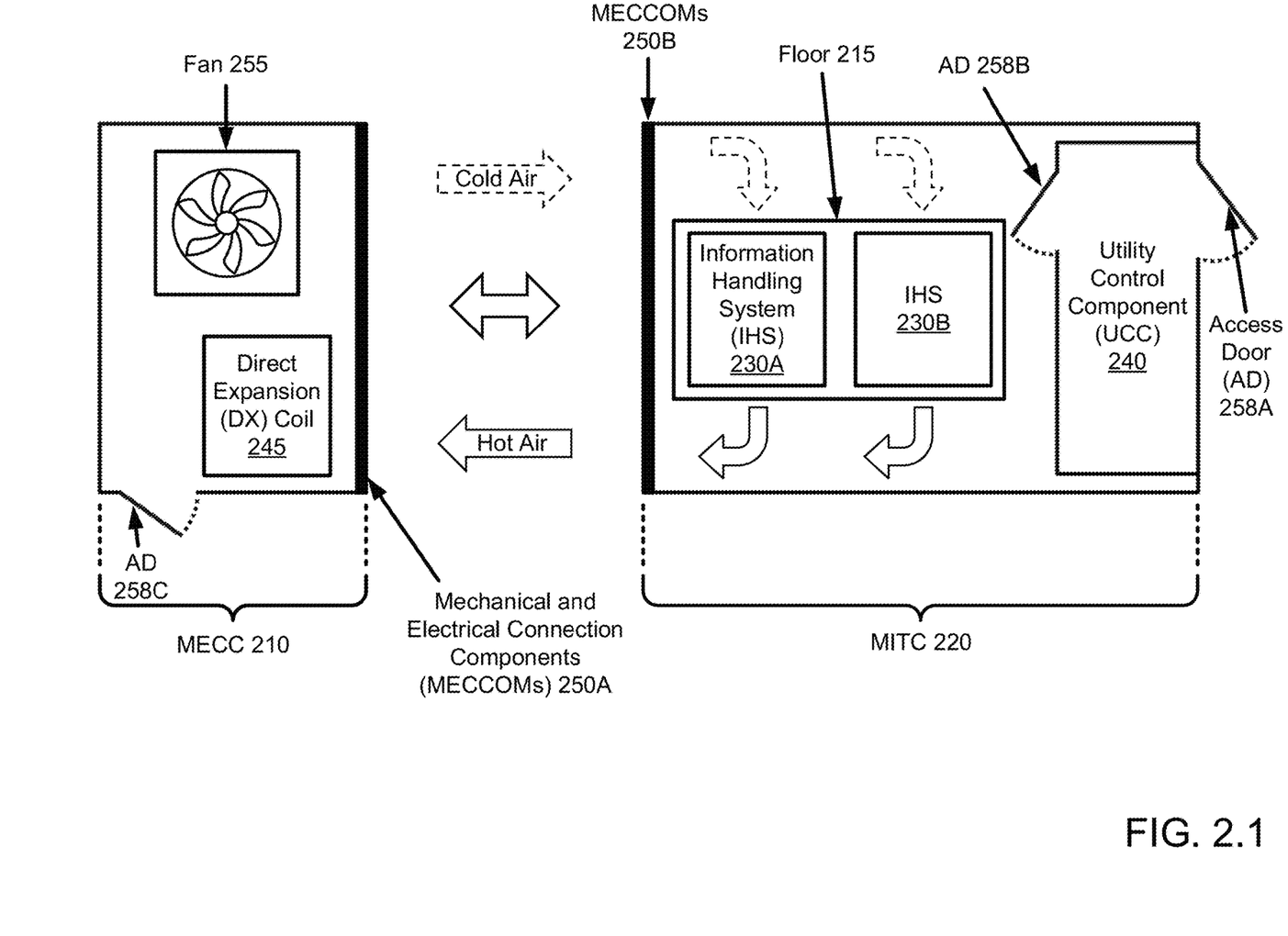

Turning now to FIG. 1, FIG. 1 shows a diagram of a system (100) in accordance with one or more embodiments of the invention. The system (100) includes a modular information technology component (MITC) (120) and a modular environmental control component (MECC) (110). The system (100) may include additional, fewer, and/or different components (e.g., modular building blocks) without departing from the scope of the invention. Each component illustrated in FIG. 1 is described below in reference to FIG. 2.1.

Turning now to FIG. 2.1, FIG. 2.1 shows a top view of the system of FIG. 1 in accordance with one or more embodiments of the invention. In an embodiment of the invention shown in FIG. 2.1, the MITC (220) may be a mechanical structure that enables one or more IHSs (230A, 230B) and a utility control component (UCC) (240) to be disposed within the MITC (220).

In one or more embodiments, while disposing, the IHSs (230A, 230B) may be affixed to a floor (215) within the MITC (220) via standard mechanical mechanisms (e.g., bolts, screws, nuts, studs, etc.). In one or more embodiments, the floor (215) is affixed to a bottom side of the MITC (220). Other mechanical or non-mechanical (e.g., glue, an adhesive tape, etc.) mechanisms for affixing the IHSs (230A, 230B) to the floor (215) may be used without departing from the scope of the invention. Additional details of the floor are described below in reference to FIGS. 3.1-4.

In one or more embodiments, a white space within the MITC (220), where the floor (215) is located, may have a functionality to host different types of standard racks (e.g., 4×750 millimeter (mm) wide racks, 5×600 mm wide racks, 5×48 rack unit (RU) racks, etc.). As a unit of measurement, the RU is equal to 1.75 inches and the RU defines an increment within a standard rack. The white space may also have a functionality to host custom designed racks. Both standard (e.g., off-the-shelf) racks and custom designed racks may be pre-integrated into the floor (215) before transportation to the customer site (e.g., a customer location, a customer facility, etc.).

In one or more embodiments, apart from hosting the IHSs (230A, 230B), the white space may also host other components, for example (but not limited to): immersion tanks, uninterruptible power supplies (UPSs), battery racks, cable management towers, cooling distribution units (CDUs), etc.

The aforementioned example is not intended to limit the scope of the invention.

In one or more embodiments, the MITC (220) may be implemented as other types of structures adapted to host, position, orient, and/or otherwise physically, mechanically, electrically, and/or thermally manage the IHSs (230A, 230B) and the UCC (240). In this manner, the MITC (220) may enable the IHSs (230A, 230B) and the UCC (240) to be densely packed without negatively impacting the operation of the IHSs (230A, 230B) and the UCC (240).

Figure 22:
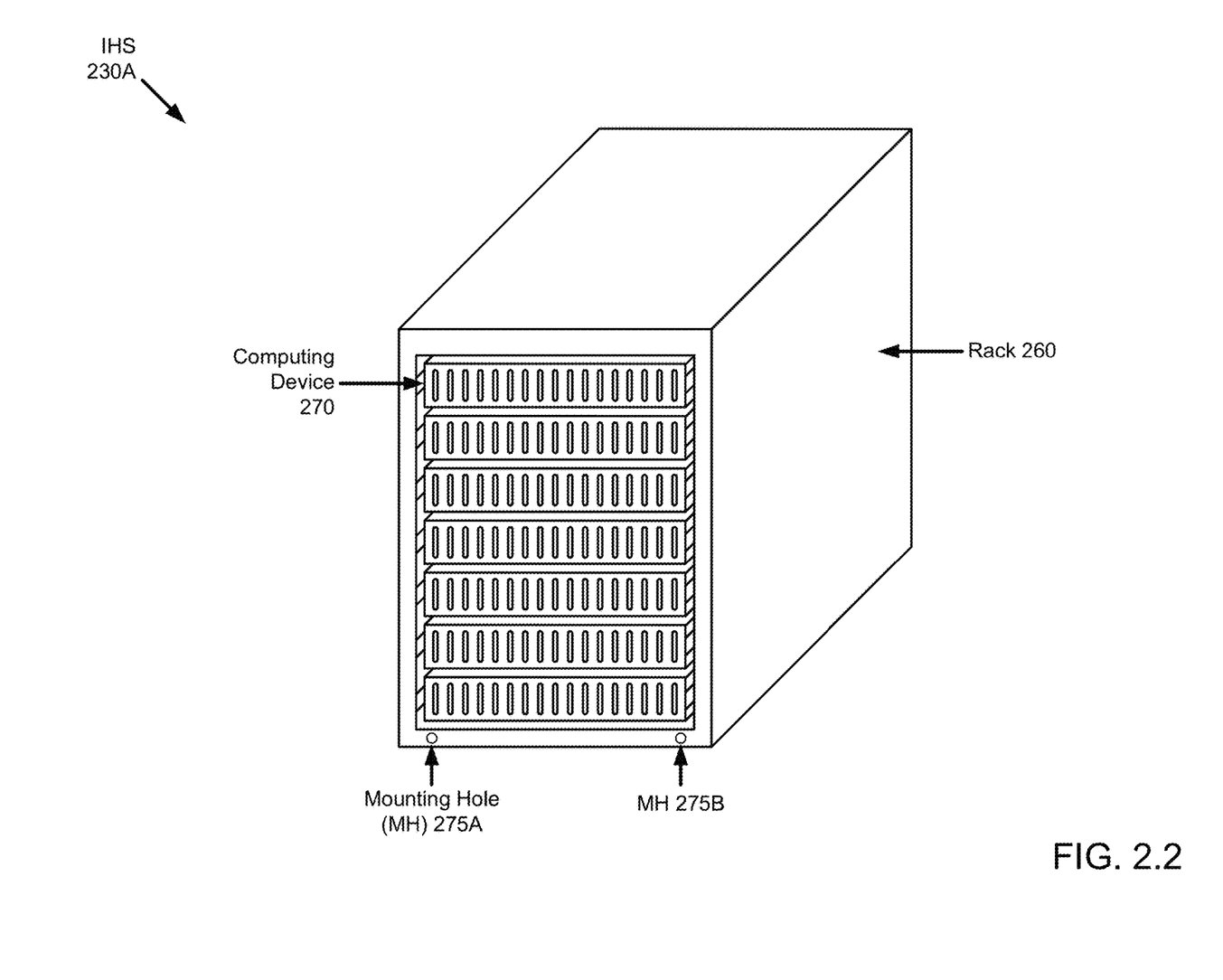
Figure 23:
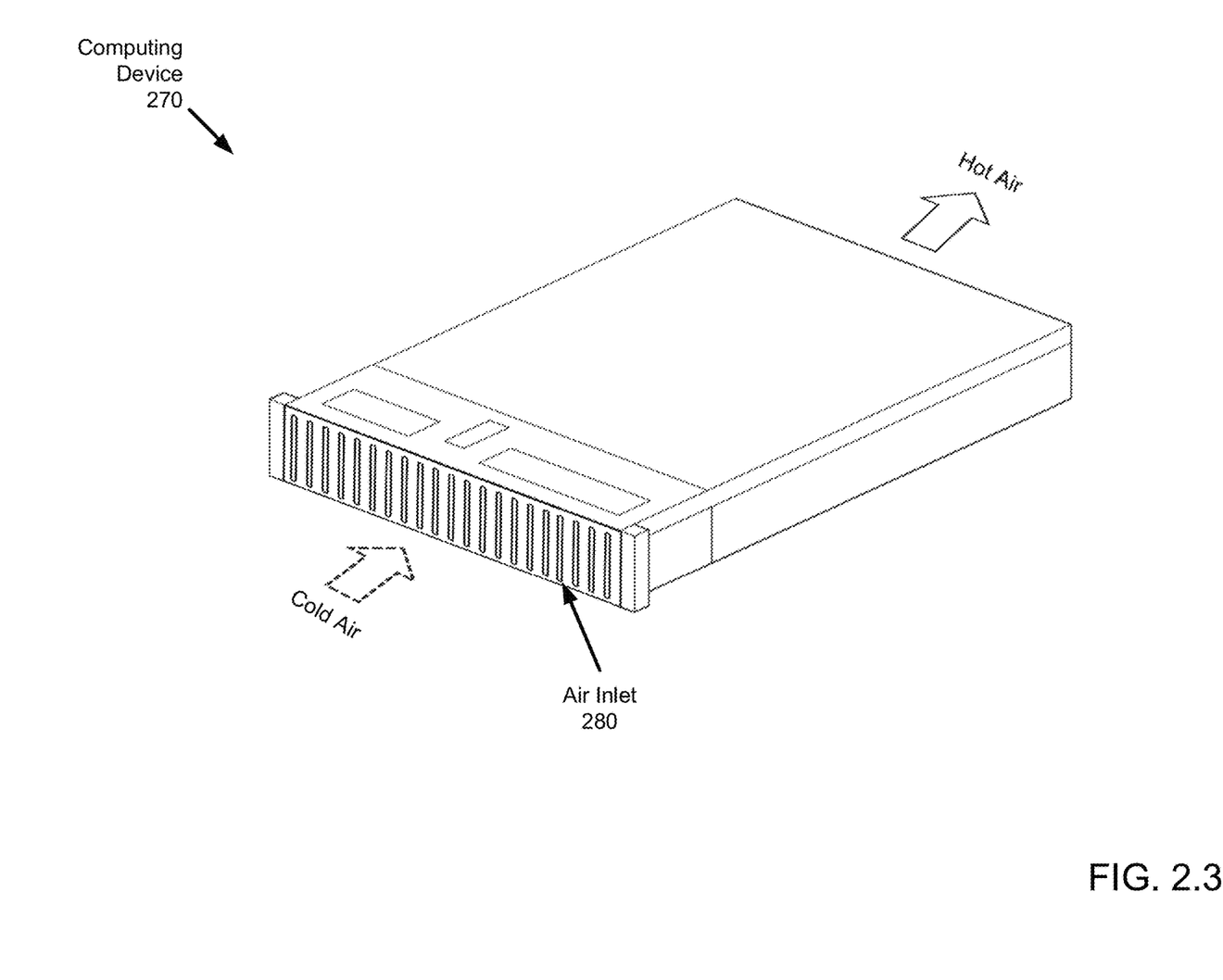

In one or more embodiments, an IHS (e.g., 230A) may include a rack and any number of computing devices. Additional details of the IHS are described below in reference to FIGS. 2.2 and 2.3.

In one or more embodiments, the UCC (240) is integrated within the MITC (220) to support different types of IHSs, in which the UCC-integrated MITC is manufactured as a monolithic system. This implies that the UCC (240) is not a separate, standalone component.

In one or more embodiments, the UCC (240) may include one or more physical devices (e.g., panels, units, switchboards, etc.) that may provide functionality, for example (but not limited to): to detect a temperature within a system, to detect fire/smoke within a system, to suppress fire/smoke within a system, to provide an access control to a component, to manage a power distribution to a component, to manage a temperature within a system, etc.

The aforementioned example is not intended to limit the scope of the invention.

In one or more embodiments, the UCC (240) may include an environmental control component (ECC) control panel (not shown) that is configured to manage a temperature within the system (e.g., 100, FIG. 1) and to provide heating and/or cooling control services. The heating and/or cooling control services may include, for example (but not limited to): (i) obtaining information relating to a temperature of one or more components within the system (e.g., 100, FIG. 1), where the information may be obtained through a number of temperature sensors (discussed below) within the system (e.g., 100, FIG. 1), (ii) determining whether the temperature within the system (e.g., 100, FIG. 1) is below or above an appropriate operating temperature level (e.g., above 0° C.), (iii) initiating, based on the determination in (ii), a heating process (e.g., activating a heater component within a MECC (210)) to bring the IHSs (230A, 230B) into their designed operating temperature levels, (iv) initiating, based on the determination in (ii), a cooling process (e.g., activating a fluid mixture unit within the MECC (210)) to bring the IHSs (230A, 230B) into their designed operating temperature levels, (v) preventing damage (e.g., thermal runaway) to the heater component in the event of overheating, etc.

While described as a physical device, the ECC control panel may be implemented as a logical entity (e.g., a program executing using a number of printed circuit board components (not shown)). For example, an IHS (e.g., 230A) may host a program that provides the functionality of the ECC control panel.

In one or more embodiments, the ECC control panel may include one or more temperature sensors. The ECC control panel may include other types of sensors (e.g., humidity sensors, vibration sensors, corrosion sensors, differential pressure sensors, etc.) without departing from the scope of the invention. In one or more embodiments, one end of a temperature sensor may be operatively connected to at least one of the components (e.g., IHSs (230A, 230B)) within the system (e.g., 100, FIG. 1) to detect a temperature within the system (e.g., 100, FIG. 1). The other end of the temperature sensor may be operatively connected to the ECC control panel, in which the ECC control panel is configured to manage the components based on the temperature within the system (e.g., 100, FIG. 1).

In one or more embodiments, the UCC (240) may include a power distribution control unit (not shown) that is configured to determine which component(s) within the system (e.g., 100, FIG. 1) receive power from a modular power supply component (not shown). For example, when the heater component needs to be activated, the modular power supply component may be instructed (e.g., by the power distribution control unit) to distribute power to the heater component. As yet another example, the modular power supply component may be instructed to distribute power to the IHSs (230A, 230B).

In one or more embodiments, the modular power supply component may be designed by considering geographic factors of the customer site and custom requirements of the customer. The factors and the requirements may include, for example (but not limited to): a hurricane rating of a location, a required number of UPSs to support an operation, a required number of physical devices in a MECC, a required resiliency of a MECC, a required input power frequency, a required input voltage, etc.

The aforementioned examples are not intended to limit the scope of the invention.

In one or more embodiments, the modular power supply component may obtain customer facility's power (which comes from a centralized power station) and then may distribute the power (i.e., provide the power) to one or more components of the system (e.g., 100, FIG. 1).

In one or more embodiments, the modular power supply component may provide DC power to the components. The modular power supply component may include functionality to convert AC power (obtained from the centralized power station) to DC power.

In one or more embodiments, the modular power supply component may provide "N" or "2×N" power supply resiliency. In one or more embodiments, "N" resiliency may refer to having an exact number of components to operate. For example, if the system (e.g., 100, FIG. 1) needs "N" components to operate and if the system (e.g., 100, FIG. 1) has "N" components, this means that the system (e.g., 100, FIG. 1) has "N" resiliency. As yet another example, if the system (e.g., 100, FIG. 1) has "2×N" power supply resiliency, this means that the modular power supply component has a functionality to provide twice the amount of power needed for the system (e.g., 100, FIG. 1).

Further, if the modular power supply component provides a single power supply feed, then the system (e.g., 100, FIG. 1) will have a low level of resiliency. If there is an additional power supply feed (e.g., a separate busway), then the system (e.g., 100, FIG. 1) will have a high level of resiliency. Having an additional power capacity (e.g., having a redundant UPS, having a redundant battery, etc.) may ensure that the system (e.g., 100, FIG. 1) has no downtime while performing a service maintenance or experiencing a failure (e.g., a hardware failure, a software failure, etc.).

In one or more embodiments, apart from the modular power supply component, the power distribution control unit may include one or more backup power resources (e.g., batteries) to support an uninterrupted service (e.g., a temperature detection service, a power distribution management service, etc.) of the UCC (240).

In one or more embodiments, the UCC (240) may also include an access control unit (not shown) that is configured to control one or more security devices that are placed at various locations on the system (e.g., 100, FIG. 1). In one or more embodiments, a security device may be, for example (but not limited to): a padlock, a badge reader, an electrified mortise lock, a biometric reader-based access contact, etc. By using, for example, a biometric reader-based access contact, the access control unit may control access provided by access doors (ADs, discussed below) (258A-258C).

The aforementioned example is not intended to limit the scope of the invention.

In one or more embodiments, the access control unit may include a blank space (with power) to plug-in third-party security devices. If a customer has an existing security system at a customer site, the customer may install (e.g., mount) the existing security system within the blank space. In this manner, the customer may have a flexibility to use built-in security devices of the UCC (240) and/or to use the existing security system for access control.

As used herein, "mounting" a particular component on another component refers to positioning the particular component to be in physical contact with the other component, such that the other component provides structural support, positioning, structural load transfer, stabilization, shock absorption, some combination thereof, or the like with regard to the particular component.

Those skilled in the art will appreciate that while the IHSs (230A, 230B) and the UCC (240) are shown as located on a particular side of the MITC (220), the IHSs (230A, 230B) and the UCC (240) may be located on any other side of the MITC (220) without departing from the scope of the invention.

In one or more embodiments, the MITC (220) includes the AD (258A). Similarly, the UCC (240) includes the AD (258B). In one or more embodiments, the ADs (258A, 258B) may be walk-in doors or walk-up doors. For example, as a walk-in door, the AD (258A) may permit user access to the UCC (240). As yet another example, as a walk-in door, the AD (258B) may permit user access to an internal environment of the MITC (220).

The aforementioned examples are not intended to limit the scope of the invention.

In one or more embodiments, a walk-up door may be a mechanical "reach through" structure, in which "walk-up" refers to not being able to walk inside of, for example, the MECC (210). Said another way, the walk-up door (258C) has not enough space for a customer to step inside of the MECC (210). However, using the walk-up door (258C), the customer may access substantially a portion of an ECC (e.g., a direct expansion (DX) coil (245)) to perform a service type of event.

In one or more embodiments, the service type of event may include, for example (but not limited to): changing an actuator, changing a filter, changing a sensor, etc. In one or more embodiments, because the customer not being able to walk inside of the MECC (210), the customer may perform the event while standing outside of the MECC (210).

The aforementioned examples are not intended to limit the scope of the invention.

In one or more embodiments, a walk-in door may be a mechanical "walk through" structure, in which "walk-in" refers to being able to walk inside of, for example, the MECC (210) to perform at least a service type of event. In one or more embodiments, the walk-in door has a greater depth than the walk-up door. Said another way, the walk-in door has enough space (e.g., a walk-in space) for a customer to step inside of the walk-in door.

In one or more embodiments, for example, the AD (258A) includes a handle (not shown) that makes easier to open or close the AD (258A) to walk through or reach through the internal environment of the MITC (220). In this manner, the customer may perform a service type of event without standing outside of the MITC (220).

The aforementioned example is not intended to limit the scope of the invention.

In one or more embodiments, the ADs (258A-258C) may be wicket doors (e.g., a door in a door), in which the ADs (258A-258C) both include a person door and a rack door. This means that the ADs (258A-258C) are big enough to pass a rack (not shown) through the ADs (258A-258C). In one or more embodiments, dotted arcs show an inward rotation or an outward rotation of the ADs (258A-258C).

Those skilled in the art will appreciate that while the ADs (258A, 258B) are shown as located on a rear side of the MITC (220) and a front side of the UCC (240), respectively, the ADs (258A, 258B) may be located on any other side of the MITC (220) and the UCC (240) without departing from the scope of the invention.

In one or more embodiments, the MITC (220) includes a connection interface, in which the connection interface is affixed to a pairing end of the MITC (220). The pairing end of the MITC (220) refers to a portion of the MITC (220) that can be paired with another component (e.g., the MECC (210)). In one or more embodiments, the connection interface of the MITC (220) includes mechanical and electrical connection components (MECCOMs) (250B). The connection interface of the MITC (220) also includes built-in airflow connection components.

In one or more embodiments, the mechanical connection components keep the MECC (210) connected to the MITC (220). The mechanical connection components also provide structural support to the MECC (210) and to the MITC (220) in case of a seismic event. The mechanical connection components may be, for example (but not limited to): steel plates with bolted connections, mechanical hard-stop components, sealing components, etc.

In one or more embodiments, "connected" may refer to "directly connected", in which there is a seal in between, for example, the connection interface of the MITC (220) and a connection interface of the MECC (210) (discussed below).

Alternatively, "connected" may refer to "connected via one or more physical components in between". For example, the connection interface of the MITC (220) is connected to the connection interface of the MECC (210), in which at least one physical component is mechanically touching the connection interfaces.

In one or more embodiments, the electrical connection components may transmit or receive power and data (e.g., temperature data, humidity data, etc.) to or from the MECC (210). For example, the UCC (240) may collect a temperature of one or more components within the MITC (220) as temperature data. Based on the collected data, the UCC (240) may activate or deactivate the MECC (210) using the electrical connection components.

In one or more embodiments, the airflow connection components may be ducting components that allow using either standard or custom designed MECCs. The airflow connection components may change (e.g., twist) a direction of an airflow formed between the MECC (210) and the MITC (220). For example, the MECC (210) may include a cold air ducting component and a hot air ducting component. The cold air ducting component may supply cold air into the MITC (220). The hot air ducting component may remove hot air from the MITC (220) and may deliver the hot air to the MECC (210).

The aforementioned examples are not intended to limit the scope of the invention.

As used herein, a "ducting component" includes any tube, pipe, conduit, or a combination thereof, that has one or more passageways through which a fluid or a gas can be conveyed. Examples of materials for a ducting component may include a cloth, a fabric, an extruded metal, a sheet metal, a polymer, or a combination thereof. A passageway of a ducting component may have any size and shape. The cross-section of a ducting component may be square, round, ovate, rectangular, or irregular. Further, a passageway of a ducting component may have a constant or changing cross-section, or a cross-section that changes over the length of the passageway.

In one or more embodiments, an area (e.g., height×width) enclosed by the connection interface of the MITC (220) is equal to an area enclosed by the connection interface of the MECC (210). In this manner, an end-to-end pairing between the MITC (220) and the MECC (210) may be installed for compatible mechanical, electrical, and airflow connections.

The MECC (210) may include one or more physical devices (e.g., ECCs) that alter characteristics (e.g., airflow directions, humidity of air, and temperature levels, etc.) of the internal environment of the MITC (220) at a macroscopic level. The physical devices may also ensure reliability of the IHSs (230A, 230B) and the UCC (240). In one or more embodiments, the physical devices may be affixed to a floor (e.g., a bottom side) of the MECC (210). In one or more embodiments, a physical device may be, for example (but not limited to): a fan (255), a DX coil (245), a fluid mixture unit, a heater component, an immersion cooling component, etc.

The aforementioned example is not intended to limit the scope of the invention.

In some cases, the system (e.g., 100, FIG. 1) may be deployed to environments that result in the temperature levels of the IHSs (230A, 230B) and the UCC (240) being outside of their designed operating temperature levels. For example, the IHSs (230A, 230B) may be designed to operate at temperature levels above 0° C. When the system (e.g., 100, FIG. 1) is deployed to an environment with harsh conditions (e.g., −40° C.-60° C.), the IHS (230A, 230B) may not operate properly and, in certain scenarios, may be damaged. To prevent the aforementioned issue, depending on environmental conditions, the physical devices either cool or heat the internal environment of the MITC (220). In this manner, stability and functionality of the IHSs (230A, 230B) and the UCC (240) may be preserved.

In one or more embodiments, as a gas mover, the fan (255) may be able to change a rate of gases being taken into and expelled from the IHSs (230A, 230B) and the UCC (240). As a refrigerant-based cooling technology, the DX coil (245) may cool the internal environment of the MITC (220) using a condensed refrigerant liquid (e.g., liquid nitrogen, hydrofluorocarbons (HFCs), etc.). In this technology, the refrigerant may expand to generate a cooling effect in the DX coil (245) that is in direct contact with a conditioned air, which will be supplied to the internal environment of the MITC (220).

In one or more embodiments, as a liquid cooling component, the fluid mixture unit may pump cooled fluid mixture (e.g., a mixture of water and glycerol) throughout hardware components (not shown) of the IHSs (230A, 230B) and the UCC (240). An absorbed air by the fluid mixture may then be transferred to an external environment of the MITC (220). Similar to refrigerant-based cooling technology, the fluid mixture unit may also use a DX coil; however, instead of using a refrigerant, the fluid mixture unit uses the fluid mixture. In one or more embodiments, glycerol may behave like an antifreeze liquid, in which the fluid mixture may operate at temperatures below 0° C.

In one or more embodiments, the MECC (210) may also take advantage of a cooling infrastructure that is already built-in at a customer site. For example, the MECC (210) may use a chilled water loop that is already available at the customer site.

As used herein, an "infrastructure" means system, components, or elements of a system that provide resources for a computing device, such as electrical power, data exchange capability with external systems, air, heat removal, and environmental control.

In one or more embodiments, the heater component may bring hardware components of the IHSs (230A, 230B) and the UCC (240) into their appropriate operating temperature levels (e.g., above 0° C.) when necessary. To initiate a heating process, the heater component may obtain a required power from the modular power supply component. The heater component may be made of silicon rubber, any other material, and/or any combination thereof that enables the heater component to perform its functions. Those skilled in the art will appreciate that the heater component may be supplied with power directly or indirectly (e.g., via a heating control component, a printed circuit board, etc.) without departing from the scope of the invention.

In one or more embodiments, the heater component has a number of surfaces that is heated and when air passes through the surfaces, an induced heat may be transferred from the heater component to the volume of air drawn into the internal environment of the MITC (220). In one or more embodiments, a number of heat sinks (not shown) may be used to provide a uniform distribution of heated volume of air drawn into the internal environment of the MITC (220) through their fins, in which a bottom portion of the number of heat sinks is affixed to the heater component. In this manner, a surface area of the heater component may be expanded indirectly to increase an efficiency of the heater component.

In one or more embodiments, the MECC (210) may provide "N+1" or "N+2" heating and/or cooling resiliency. In one or more embodiments, "N+1" cooling resiliency may indicate that even if one of the physical devices is deactivated (because of a service maintenance), the IHSs (230A, 230B) may still operate. For example, the MECC (210) has four fans and the MECC (210) has "N+1" resiliency. In this case, the required number of fans to support operation of the IHSs (230A, 230B) is three and the MECC (210) has a redundant fan. Having additional heating and/or cooling capacity (e.g., having a redundant fan, having a redundant heater component, etc.) may ensure that the IHSs (230A, 230B) has no downtime while performing a service maintenance or experiencing a failure.

In one or more embodiments, a power usage effectiveness (PUE) value of a component (e.g., an ECC, an IHS, etc.) at a data center indicates how energy efficient the component is. For example, as an ideal case, if a PUE value of an ECC is equal to one, this means that the ECC uses 100% of an input power that is provided to the ECC. In general, a PUE value of an ECC at a traditional data center is on average 1.57 (e.g., 64% effectiveness). Comparing to the PUE value of the ECC at the traditional data center, a PUE value of the MECC (210) is on average 1.01 (e.g., 99% efficiency)–1.043 (e.g., 95% efficiency), depending on where the system (e.g., 100, FIG. 1) is deployed. For example, if the system (e.g., 100, FIG. 1) is deployed to a hot environment (e.g., Phoenix, AZ), the PUE value of the MECC (210) may be 1.043. As yet another example, if the system (e.g., 100, FIG. 1) is deployed to a mild (e.g., neither hot nor cold) environment (e.g. San Diego, CA), the PUE value of the MECC (210) may be 1.01.

The aforementioned example is not intended to limit the scope of the invention.

In one or more embodiments, the MECC (210) supplies cold air (shown with a dashed line arrow) to the internal environment of the MITC (220) (including the UCC (240)) via the built-in airflow connection components. The MECC (210) also removes hot air (shown with a solid line arrow) from the internal environment of the MITC (220) (including the UCC (240)) via the built-in airflow connection components. In one or more embodiments, the dashed line and the solid line arrows inside of the MITC (220) may be referred to as a "cold aisle" and a "hot aisle", respectively.

The cold aisle may refer to an area (e.g., a space) in which conditioned (e.g., cold) air is introduced to a front side of the IHSs (230A, 230B) and to the UCC (240) to remove heat. The cold air may also be introduced to other components located within the internal environment of the MITC (220) without departing from the scope of the invention.

The hot aisle may refer to an area in which conditioned (e.g., hot) air is removed from a rear side of the IHSs (230A, 230B) and from the UCC (240) for the reliability of the IHSs (230A, 230B) and the UCC (240). The hot air may also be removed from other components located within the internal environment of the MITC (220) without departing from the scope of the invention.

In one or more embodiments, similar to MITC (220), the MECC (210) includes the AD (258C). In one or more embodiments, the AD (258C) may be a walk-in door or a walk-up door (as discussed above). For example, as a walk-in door, the AD (258C) may permit user access to the MECC (210).

The aforementioned example is not intended to limit the scope of the invention.

Those skilled in the art will appreciate that while the AD (258C) is shown as located on a right side of the MECC (210), the AD (258C) may be located on any other side of the MECC (210) without departing from the scope of the invention.

In one or more embodiments, as being separate components and as having separate ADs, once paired, the MITC (220) and the MECC (210) provide an additional security measure to the user access. For example, user 1 has access to the AD (258C) and user 2 has access to the ADs (258A-258C). In this case, because user 2 has access to all ADs, user 2 can access to the UCC (240), the MITC (220), and the MECC (210). However, because user 1 has access only to the AD (258C), user 1 cannot access to the UCC (240) and to the MITC (220).

The aforementioned example is not intended to limit the scope of the invention.

In one or more embodiments, similar to the MITC (220), the MECC (210) includes a connection interface, in which the connection interface is affixed to a pairing end of the MECC (210). The pairing end of the MECC (210) refers to a portion of the MECC (210) that can be paired with another component (e.g., the MITC (220)). In one or more embodiments, similar to the MITC (220), the connection interface of the MECC (210) includes MECCOMs (250A). The connection interface of the MECC (210) also includes the built-in airflow connection components.

In one or more embodiments, the MITC (220) and the MECC (210) are oriented in a same direction. Further, a double-headed arrow shows modularity of the system (e.g., 100, FIG. 1), in which the MECC (210) may be attached to, or detached from the MITC (220) along the same direction.

Those skilled in the art will appreciate that while the IHSs (230A, 230B) are oriented in parallel to the MECCOMs (250B), the IHSs (230A, 230B) may be oriented in any direction without departing from the scope of the invention.

In one or more embodiments, the end-to-end and medium form factor (e.g., medium shape) of the MDC (the system (e.g., 100, FIG. 1)) described in FIGS. 1 and 2.1 makes the system (e.g., 100, FIG. 1) deployable to, for example (but not limited to): space-unlimited locations, remote locations, etc. The space-unlimited locations may be, for example (but not limited to): university campuses, research and development locations, etc. The remote locations (e.g., edge locations) may be locations that are away from specialized IT and security personnel to maintain an operation of the MDC.

Providing multiple functionalities and fitting these functionalities into the medium form factor make formation, deployment, and operation of the end-to-end MDC easier for a customer that needs higher computing power. These functionalities also make possible to move from centralized cloud computing to decentralized edge computing. These functionalities may include, for example (but not limited to): a pre-integrated and ready-to-use IHS, an ability to plug into an existing security system, multiple ECC options, a high power resiliency, an optimized power distribution, higher power density within a data center, an easy service access, flexibility to support third-party components, a customer-specific component design, etc.

Further, a physical and functional split between the MECC (210) and the MITC (220) enables a variety of cooling technologies, capacities, and resiliencies to be paired with a variety of power capacities, resiliencies, and IHS technologies.

Turning now to FIG. 2.2, FIG. 2.2 shows a diagram of the IHS (230A) in accordance with one or more embodiments of the invention. The IHS (230A) may include a rack (260) and any number of computing devices (e.g., 270).

In one or more embodiments, the rack (260) may be a mechanical structure that enables the computing devices to be positioned with respect to one another. For example, the rack (260) may be a mountable enclosure that enables the computing devices to be disposed within the rack (260). The rack (260) may be implemented as other types of structures adapted to host, position, orient, and/or otherwise physically, mechanically, electrically, and/or thermally manage the computing devices. By managing the computing devices, the rack (260) may enable the computing devices to be densely packed in a space without negatively impacting the operation of the IHS (230A).

Figure 31:
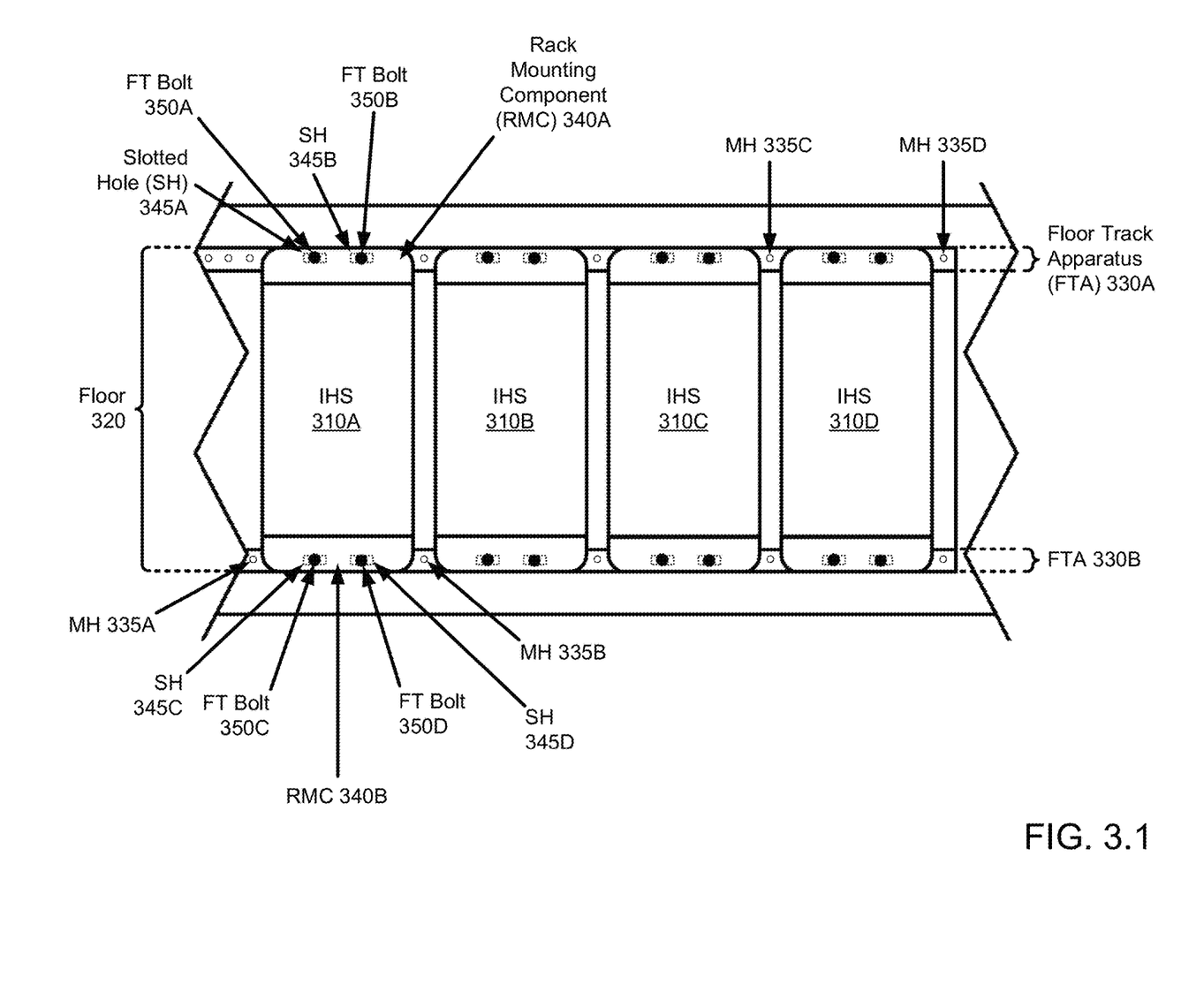
Figure 32:
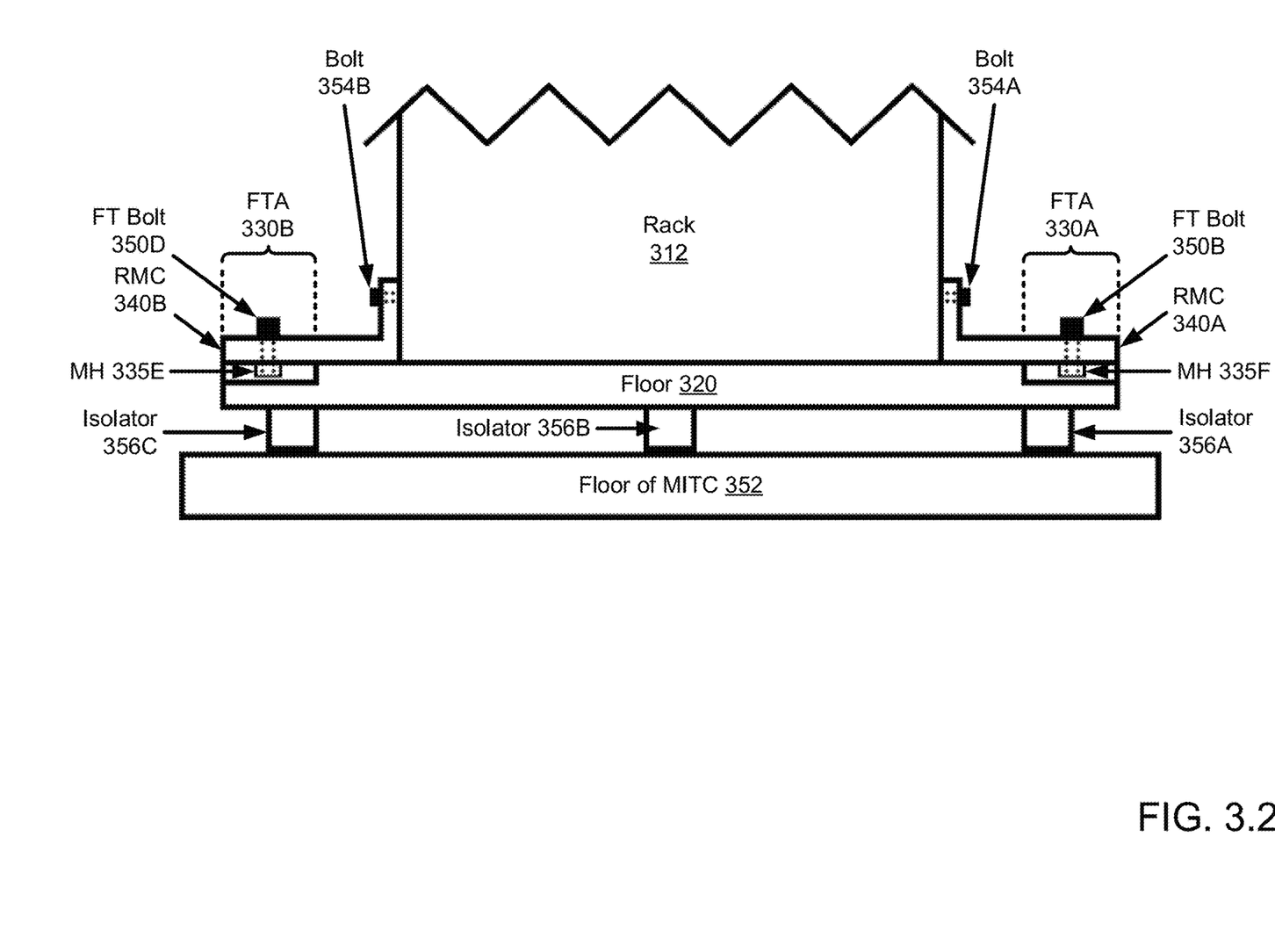

In one or more embodiments, the rack (260) may include one or more MHs (275A, 275B). Additional details of the MHs are described below in reference to FIGS. 3.1 and 3.2.

In one or more embodiments, a computing device (e.g., 270) may be a mechanical structure for housing components of the IHS (230A). For example, the computing device (e.g., 270) may be implemented as a rack-mountable enclosure for housing components of the IHS (230A). The computing device (e.g., 270) may be adapted to be disposed within the rack (260) and/or utilize services provided by the rack (260) and/or other components available in the system (e.g., 100, FIG. 1).

In one or more embodiments, a computing device positioned into a pre-integrated rack may be ready-to-use (e.g., pre-configured with software, hardware, etc.) when deployed to the customer site. However, the customer may alter a configuration of the pre-configured computing device after the deployment. For example, the customer may increase memory capacity of the computing device after the deployment. As yet another example, the customer may increase processor capacity of the computing device after the deployment.

The aforementioned examples are not intended to limit the scope of the invention.

In one or more embodiments, a set of isolators (see FIG. 3.2) may be attached to the components (e.g., the IHSs (e.g., 230A, 230B, FIG. 2.1), the floor (e.g., 320, FIG. 3.1), etc.) of the system (e.g., 100, FIG. 1) to make sure that the components are ready-to-use when they deployed to the customer site. In one or more embodiments, the set of isolators provides a shock isolation to the components such that the components may be protected from any damage (e.g., a vibrational damage). Additional details of the set of isolators are described below in reference to FIG. 3.2.

Turning now to FIG. 2.3, FIG. 2.3 shows a diagram of the computing device (270) in accordance with one or more embodiments of the invention. In one or more embodiments, the computing device (270) includes six sides (i.e., top, bottom, right, left, front, and rear), in which air drawn into from a front side of the computing device (e.g., via an air inlet (280)) and expelled from the rear side of the computing device (e.g., via one or more ECCs). An airflow direction is shown with a dashed line arrow (cold air) and a solid line arrow (hot air). In general, air incoming from the front side of the computing device (270) is cooler than air outgoing from the rear side of the computing device (270).

In one or more embodiments, to provide services, the computing device (270) may utilize resources provided by a number of hardware components hosted within the computing device (270). The hardware components may be, for example (but not limited to): processors, non-persistent storage devices, printed circuited boards, persistent storage devices, peripheral components interconnects, special purpose hardware components, etc. In one or more embodiments, some of the hardware components may be omitted or additional hardware components may be added based on the services provided by the computing device (270).

The aforementioned example is not intended to limit the scope of the invention.

As used herein, "computing" refers to any operations that may be performed by a computer, including (but not limited to): computation, data storage, data retrieval, communications, etc.

As used herein, a "computing device" includes any of various devices in which a computing operation may be carried out. A computing device may be, for example (but not limited to): a compute IHS component, a storage IHS component, a network device, a telecommunications component, etc.

The aforementioned examples are not intended to limit the scope of the invention.

In one or more embodiments, the medium form factor of the system described in FIG. 2.1 may increase a PUE value of the computing device (270). For example, because the system described in FIG. 2.1 includes a separate cooling and/or heating unit (210), the computing device (270) may not have a fan and/or a heating component. In this manner, the computing device (270) may become more power dense and power-efficient.

Turning now to FIG. 3.1, FIG. 3.1 shows a top view of a portion of the system of FIG. 1 in accordance with one or more embodiments of the invention. In an embodiment of the invention shown in FIG. 3.1, the embodiment includes one or more IHSs (310A-310D), a floor (320), and one or more rack mounting components (RMCs) (e.g., 340A, 340B). The floor (320) may be the same as the floor (215) as discussed above in reference to FIG. 2.1. Similarly, the IHS (310A) may be the same as the IHS (230A) as discussed above in reference to FIG. 2.1.

In one or more embodiments, the floor (320) includes two FTAs (330A, 330B), in which each of the FTAs (330A, 330B) includes a set of MHs (e.g., 335A, 335C, etc.). For example, the FTA (330A) includes a first set of MHs (e.g., 335C, 335D, etc.) and the FTA (330B) includes a second set of MHs (e.g., 335A, 335B, etc.). In one or more embodiments, similar to the computing device (e.g., 270, FIG. 2.3), the floor (320) includes six sides, in which the FTA (330A) is located on the right side of the floor (320) and the FTA (330B) is located on the left side of the floor (320).

In one or more embodiments, the FTA (330A) extends along the entire right side of the floor (320). Similarly, the FTA (330B) extends along the entire left side of the floor (320). Further, an orientation of the right side of the floor (320) and an orientation of the left side of the floor (320) are parallel to each other.

Those skilled in the art will appreciate that while the FTAs (330A, 330B) are shown as located on the right and left sides of the floor (320), the FTAs (330A, 330B) may be located on any other two sides (that are parallel to each other) of the floor (320) without departing from the scope of the invention.

In one or more embodiments, the first set of MHs (e.g., 335C, 335D, etc.) extends along the length of the FTA (330A). Said another way, the first set of MHs (e.g., 335C, 335D, etc.) is aligned along the entire right side of the floor (320). Similarly, the second set of MHs (e.g., 335A, 335B, etc.) extends along the length of the FTA (330B). Said another way, the second set of MHs (e.g., 335A, 335B, etc.) is aligned along the entire left side of the floor (320). In one or more embodiments, because the set of MHs (e.g., 335A, 335C, etc.) are either aligned along the entire right side of the floor (320) or along the entire left side of the floor (320), the FTAs (330A, 330B) may be referred to as "rails".

In one or more embodiments, in order to secure (e.g., mount) different types (and different sizes) of components (discussed below) to the floor (320), the set of MHs (e.g., 335A, 335C, etc.) are positioned (e.g., spaced) along the length of the FTAs (330A, 330B) with a specific pattern (e.g., an optimal pattern). In an embodiment of the invention shown in FIG. 3.1, the set of MHs (e.g., 335A, 335C, etc.) is spaced at 150 mm apart (i) to secure any size of IHS to the floor (320) and (ii) to be aligned with any size of slotted hole (SH) (e.g., 345A, 345B, etc.) of the RMCs (e.g., 340A, 340B). With 150 mm spacing between the set of MHs (e.g., 335A, 335C, etc.), the SHs (e.g., 345A, 345B, etc.) will always be aligned with at least two MHs, in which "two" is the minimum number of MHs required to secure a component to the floor (320).

For example, without redesigning the floor (320), an 800 mm wide rack and a 750 mm wide rack may be secured to any location on the floor (320) using different types of RMCs. In this example, (i) the 800 mm wide rack may be secured using a first type of RMC, in which the SHs of the first type of RMC align with four MHs, and (ii) the 750 mm wide rack may be secured using a second type of RMC, in which the SHs of the second type of RMC align with three Wis.

Continuing with the example discussed above, a 600 mm wide rack may also be secured to any location on the floor (320) using a third type of RMC, in which the SHs of the third type of RMC align with two Wis. In one or more embodiments, while the width of the 600 mm wide rack determines how many MHs will be aligned with the SHs of the third type of RMC, a position of the SHs also determines how many MHs will be aligned with the SHs of the third type of RMC. For example, if the SHs are sparsely positioned along a second portion (discussed below) of the third type of RMC, the SHs may be aligned with two MHs. As yet another example, if the SHs are closely positioned along the second portion of the third type of RMC, the SHs may be aligned with four MHs. In this case, similar to the 800 mm wide rack, the 600 mm wide rack may also be secured to the floor (320) via four MHs.

The aforementioned examples are not intended to limit the scope of the invention.

Those skilled in the art will appreciate that while the 800 mm wide, 750 mm wide, and 600 mm wide racks are considered above, any other standard and custom designed components may be secured to the floor (320) using the FTAs (330A, 330B) without departing from the scope of the invention.

In one or more embodiments, the floor (320) includes one or more portions (e.g., sections) (see FIG. 3.2), in which a second portion of the floor (320) is elevated relative to a first portion and a third portion of the floor (320). In one or more embodiments, (i) the IHSs (310A-310D) are located on the second portion of the floor (320), (ii) the FTA (330A) is located on (e.g., integrated into) the first portion of the floor (320), and (iii) the FTA (330B) is located on the third portion of the floor (320).

In one or more embodiments, apart from hosting the IHSs (310A-310D), the second portion may also host other components, for example (but not limited to): immersion tanks, UPSs, CDUs, battery racks, transformers, cable management towers, etc. Further, the floor (320) may be, for example (but not limited to): an aluminum floor, a steel floor, etc.

The aforementioned examples are not intended to limit the scope of the invention.

In one or more embodiments, in order to secure (e.g., to restrain) any size of component to the floor (320), each RMC may be a bracket (e.g., an L bracket) that includes two portions. For example, a first portion of the RMC (340A) refers to a portion of the RMC (340A) that is secured to the first set of MHs (e.g., 335C, 335D, etc.) to affix the IHS (310A) to the floor (320). A second portion of the RMC (340A) refers to a portion of the RMC (340A) that is secured to a first set of MHs (e.g., 275A, 275B, FIG. 2.2) of the IHS (310A) to secure the IHS (310A) to the RMC (340A) itself. Additional details of the second portion of the RMC are described below in reference to FIG. 3.2.

In one or more embodiments, the first portion of the RMC (340A) includes the SHs (345A, 345B) that allow a first set of floor track (FT) bolts (350A, 350B) to pass through and interface with the first set of MHs (e.g., 335C, 335D, etc.). When the SHs (345A, 345B) are aligned with the first set of MHs (e.g., 335C, 335D, etc.), the first set of FT bolts (350A, 350B) is used to secure the RMC (340A) to the FTA (330A). In this manner, a front side of the IHS (310A) is affixed to the floor (320).

Similarly, a first portion of the RMC (340B) refers to a portion of the RMC (340B) that is secured to the second set of MHs (e.g., 335A, 335B, etc.) to affix the IHS (310A) to the floor (320). A second portion of the RMC (340B) refers to a portion of the RMC (340B) that is secured to a second set of MHs (not shown) located on the IHS (310A) to secure the IHS (310A) to the RMC (340B) itself.

In one or more embodiments, the first portion of the RMC (340B) includes the SHs (345C, 345D) that allow a second set of FT bolts (350C, 350D) to pass through and interface with the second set of MHs (e.g., 335A, 335B, etc.). When the SHs (345C, 345D) are aligned with the second set of MHs (e.g., 335A, 335B, etc.), the second set of FT bolts (350C, 350D) is used to secure the RMC (340B) to the FTA (330B). In this manner, a rear side of the IHS (310A) is affixed to the floor (320).

In one or more embodiments, the RMCs (340A, 340B) may provide one or more functionalities to the IHS (310A). For example, the RMCs (340A, 340B) may act as mechanical hard-stop components and may provide structural support to the IHS (310A) in case of a seismic event. As yet another example, the RMCs (340A, 340B) may also provide structural support to the IHS (310A) to keep the IHS (310A) connected to the floor (320).

The aforementioned examples are not intended to limit the scope of the invention.

In one or more embodiments, in addition to being mechanical hard-stop components, the RMCs (340A, 340B) may act as air containment components, in which the RMCs (340A, 340B) may segregate cold air in a cold aisle from hot air in a hot aisle (or from other air in the MITC (e.g., 210, FIG. 2.1)). In this manner, the RMCs (340A, 340B) may (i) increase cooling efficiency of the MECC (e.g., 210, FIG. 2.1), (ii) reduce the amount of time of the MECC (e.g., 210, FIG. 2.1) needs to operate, (iii) reduce recirculation (e.g., mixing of hot air with cold air), (iv) bypass airflow from one aisle to another aisle, (v) improve usability and serviceability of the computing devices (e.g., 270, FIG. 2.2), (vi) enhance thermal management of the internal environment of the MITC (e.g., 220, FIG. 2.1), (vii) prevent damage to the hardware components of the computing devices (e.g., 270, FIG. 2.2), and (viii) improve functionality of the hardware components of the computing devices (e.g., 270, FIG. 2.2).

Those skilled in the art will appreciate that while the FT bolts (350A-350D) are used to secure the RMCs (340A, 340B) (and the IHS (310A)) to the FTAs (330A, 330B), any other mechanical or non-mechanical components may be used to secure the RMCs (340A, 340B) (and the IHS (310A)) to the FTAs (330A, 330B) without departing from the scope of the invention.

Those skilled in the art will appreciate that while the first portions of the RMCs (340A, 340B) are shown as having two SHs, the first portions of the RMCs (340A, 340B) may have more SHs or may have only one SH (as long as that SH aligns with at least two MHs) without departing from the scope of the invention.

Those skilled in the art will appreciate that while the RMCs (340A, 340B) are shown as brackets, the RMCs (340A, 340B) may be in another shape (while still providing the same functionalities) without departing from the scope of the invention.

As shown in FIG. 3.1, both RMCs (340A, 340B) have the same size to affix the IHS (310A) to the floor (320). As discussed above, without redesigning, the floor (320) has the functionality to host different types of IHSs with the help of the FTAs (330A, 330B). Assuming that the IHS (310A) includes a 750 mm wide rack (e.g., a "first size" rack), the RMCs (340A, 340B) may then be referred to as "first size" RMCs.

When a second IHS (not shown), which has a rack width greater than the rack width of the IHS (310A), needs to be affixed to the floor (320), "second size" RMCs may need to be used because the second IHS includes a "second size" rack (e.g., a 800 mm wide rack). Similarly, when a third IHS (not shown), which has a rack width less than the rack width of the IHS (310A), needs to be affixed to the floor (320), "third size" RMCs may need to be used because the third IHS includes a "third size" rack (e.g., a 600 mm wide rack).

Those skilled in the art will appreciate that while the details of the RMCs (340A, 340B), the IHS (310A), and the FTAs (330A, 330B) are discussed above, those details also apply to other RMCs, IHSs, and FTAs disposed within the MITC (e.g., 220, FIG. 2.1) without departing from the scope of the invention.

Turning now to FIG. 3.2, FIG. 3.2 shows a side view of a portion of the system of FIG. 1 in accordance with one or more embodiments of the invention. In an embodiment of the invention shown in FIG. 3.2, the embodiment includes a rack (312), a floor of the MITC (352), a set of bolts (e.g., 354A, 354B, etc.), a set of isolators (356A-356C), the floor (320), the FT bolts (e.g., 350B, 350D, etc.), the FTAs (330A, 330B), and the RMCs (340A, 340B). In one or more embodiments, the rack (312) may be the rack of the IHS (310A) as discussed above in reference to FIG. 3.1.

As shown in FIG. 3.2, the floor (320) includes three portions, in which (i) the rack (312) is located on the second portion of the floor (320), (ii) the FTA (330A) is located on the first portion of the floor (320), and (iii) the FTA (330B) is located on the third portion of the floor (320). In one or more embodiments, the floor (320) has a shape that is elevated in the middle (e.g., the second portion) and depressed on the sides. Said another way, the second portion is elevated (e.g., has a different height) relative to the depressions (e.g., first portion and the third portion). In those depressions (e.g., gaps), the FTAs (330A, 330B) are integrated such that the FTAs (330A, 330B) fill out the depressions.

Those skilled in the art will appreciate that while the floor (320) is shown as having a particular shape, the floor (320) may be in another shape (while still providing the same functionalities) without departing from the scope of the invention.

As discussed above in reference to FIG. 3.1, each RMC includes two portions (e.g., the first portion and the second portion). As shown in FIG. 3.2, the first portion of the RMC (340A) allows the first set of FT bolts (e.g., 350B) to pass through and interface with (shown with dashed lines) the first set of MHs (e.g., 335F). When the SHs of the RMC (340A) are aligned with the first set of MHs (e.g., 335F), the first set of FT bolts (e.g., 350B) is used to secure the RMC (340A) to the FTA (330A). In this manner, a front side of the rack (312) is affixed to the floor (320).

Further, the second portion of the RMC (340A) includes a first set of holes (not shown) to be aligned with the first set of MHs (e.g., 275A, 275B, FIG. 2.2) located on the rack (312). The first set of holes allows a first set of bolts (e.g., 354A) to pass through and interface with (shown with the dashed lines) the first set of MHs (e.g., 275A, 275B, FIG. 2.2) located on the rack (312). When the first set of holes is aligned with the first set of MHs (e.g., 275A, 275B, FIG. 2.2) located on the rack (312), the first set of bolts (e.g., 354A) is used to secure the rack (312) to the RMC (340A) itself.

Similarly, the first portion of the RMC (340B) allows the second set of FT bolts (e.g., 350D) to pass through and interface with (shown with the dashed lines) the second set of MHs (e.g., 335E). When the SHs of the RMC (340B) are aligned with the second set of MHs (e.g., 335E), the second set of FT bolts (e.g., 350D) is used to secure the RMC (340B) to the FTA (330B). In this manner, a rear side of the rack (312) is affixed to the floor (320).

Further, the second portion of the RMC (340B) includes a second set of holes (not shown) to be aligned with the second set of MHs (not shown) located on the rack (312). The second set of holes allows a second set of bolts (e.g., 354B) to pass through and interface with (shown with the dashed lines) the second set of MHs located on the rack (312). When the second set of holes is aligned with the second set of MHs located on the rack (312), the second set of bolts (e.g., 354B) is used to secure the rack (312) to the RMC (340B) itself.

Those skilled in the art will appreciate that while the set of bolts (e.g., 354A, 354B, etc.) is used to secure the RMCs (340A, 340B) to the rack (312), any other mechanical or non-mechanical components may be used to secure the RMCs (340A, 340B) to the rack (312) without departing from the scope of the invention.

In one or more embodiments, the floor (320) is affixed to the set of isolators (356A-356C). Similar to the floor (320), each isolator includes six sides, in which the top side of each isolator is affixed to the bottom side of the floor (320). Further, the bottom side of each isolator is affixed to the floor of the MITC (352), in which the floor of the MITC (352) may be to the bottom side of the MITC (e.g., 220, FIG. 2.1).

In one or more embodiments, the set of isolators (356A-356C) makes sure that the rack (312) (and the computing devices disposed within) are ready-to-use when the system (e.g., 100, FIG. 1) is deployed to the customer site. In one or more embodiments, the set of isolators (356A-356C) provides a shock isolation to the rack (312) such that the computing devices disposed within the rack (312) may be protected from any damage.

In one or more embodiments, the top side of each isolator may be affixed to the bottom side of the floor (320) using mechanical or non-mechanical mechanisms without departing from the scope of the invention. Similarly, the bottom side of each isolator may be affixed to the floor of the MITC (352) using mechanical or non-mechanical mechanisms without departing from the scope of the invention. Further, because the floor (320) is located on top of the set of isolators (356A-356C), the floor (320) may be referred to as a "raised floor".

A "raised floor" is a data center construction model where a slightly higher floor is constructed above a floor (e.g., a bottom side) of the data center. A raised floor allows to generate an open space between the two floors for a better (i) cold air distribution (via, for example, bottom ducting components), (ii) air containment, and (iii) cable management within the data center.

Figure 4:
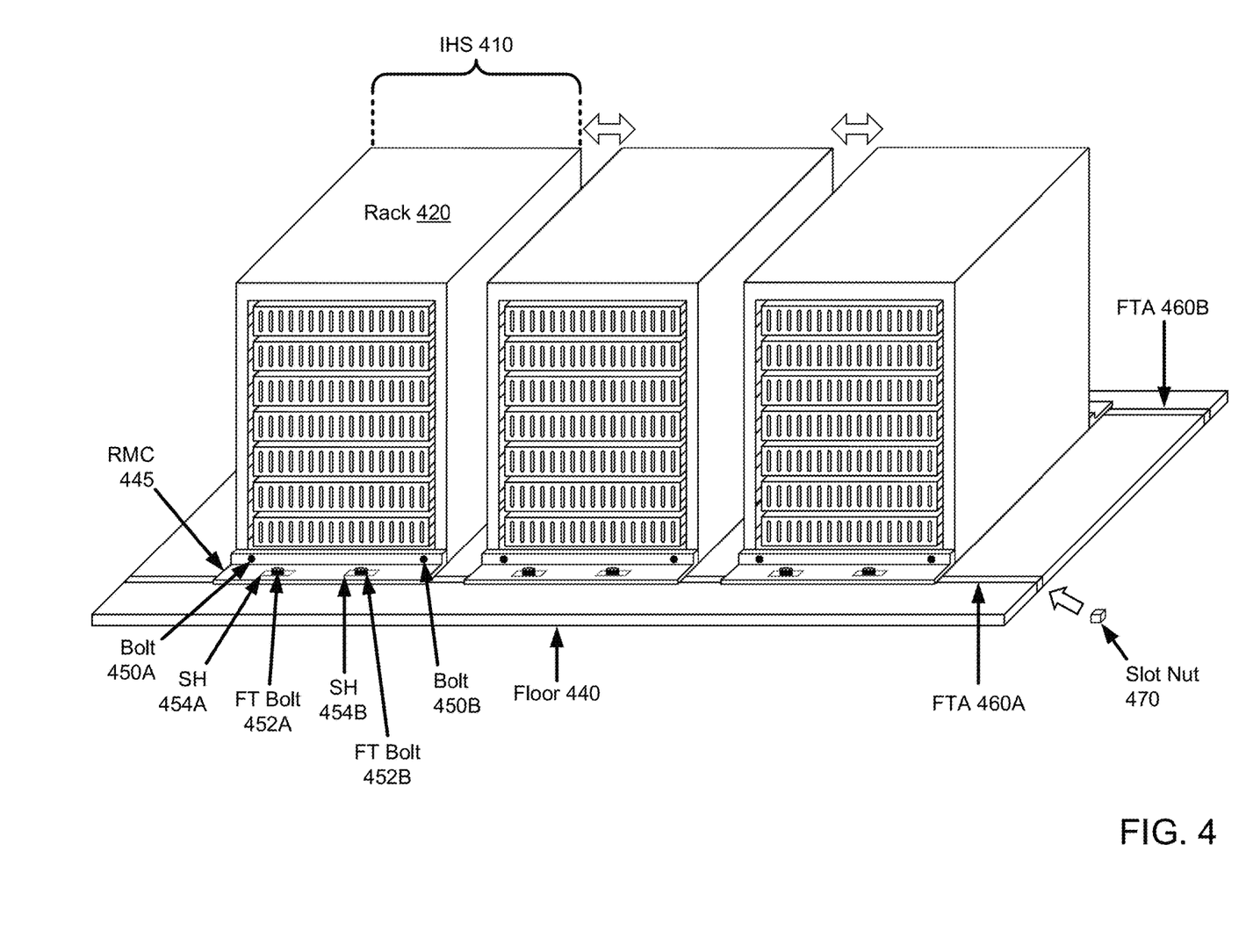
FIG. 4 shows a diagram of a portion of the system of FIG. 1 in accordance with one or more embodiments of the invention.

Turning now to FIG. 4, FIG. 4 shows a diagram of a portion of the system of FIG. 1 in accordance with one or more embodiments of the invention. In an embodiment of the invention shown in FIG. 4, the embodiment includes one or more IHSs (e.g., 410), a floor (440), and one or more RMCs (e.g., 445). The floor (440) may be the same as the floor (320) as discussed above in reference to FIG. 3.1. Similarly, the IHS (410) may be the same as the IHS (230A) as discussed above in reference to FIG. 2.1.

In one or more embodiments, the floor (440) includes two FTAs (460A, 460B), in which the FTAs (460A, 460B) are grooves (e.g., slots). The floor (440) includes six sides, in which the FTA (460A) is located on the left side of the floor (440) and the FTA (460B) is located on the right side of the floor (440). In comparison to the FTAs discussed above in reference to FIG. 3.1, the groove FTAs (460A, 460B) do not include any built-in MHs. When necessary, for example, a slot nut (470) slides into the FTA (460A) and becomes positioned inside the FTA (460A) to affix the IHS (410) to the floor (440). For this reason, the slot nut (470) acts as an MH inside the FTA (460A). Additional details of the affixing process are described below.

In one or more embodiments, the FTA (460A) extends along the entire left side of the floor (440). Similarly, the FTA (460B) extends along the entire right side of the floor (440). Further, an orientation of the right side of the floor (440) and an orientation of the left side of the floor (440) are parallel to each other. In one or more embodiments, the FTAs (460A, 460B) do not have a uniform shape, in which the FTAs (460A, 460B) include some protrusions and/or recesses. In this manner, for example, the slot nut (470) stays inside the FTA (460A) after positioned into a specific location within the FTA (460A).

Those skilled in the art will appreciate that while the FTAs (460A, 460B) are shown as located on the left and right sides of the floor (440), the FTAs (460A, 460B) may be located on any other two sides (that are parallel to each other) of the floor (440) without departing from the scope of the invention.

In one or more embodiments, without redesigning the floor (440), different types of IHSs (e.g., an 800 mm wide rack, a 750 mm wide rack, a custom designed rack, etc.) may be secured to any location on the floor (440) (shown with double-headed arrows) by positioning slot nuts (e.g., 470) into specific locations inside the FTAs (460A, 460B). In this manner, any type of RMC (e.g., a first type, a second type, etc.) may be affixed to the FTAs (460A, 460B). Further, based on how many SHs needs to be bolted (to affix a component (e.g., IHS (410)) to the floor (440)), additional slot nuts may be positioned into the FTAs (460A, 460B), or some of the slot nuts may be removed from the FTAs (460A, 460B).

In one or more embodiments, a first portion of the RMC (445) includes SHs (454A, 454B) that allow a first set of FT bolts (452A, 452B) to pass through and interface with a first set of slot nuts (e.g., 470). When the SHs (454A, 454B) are aligned with the first set of slot nuts (e.g., 470), the first set of FT bolts (452A, 452B) is used to secure the RMC (445) to the FTA (460A). In this manner, a front side of the IHS (410) is affixed to the floor (440).

Those skilled in the art will appreciate that while the first set of FT bolts (452A, 452B) and the first set of slot nuts (e.g., 470) are used to secure the RMC (445) (and the IHS (410)) to the FTA (460A), any other mechanical or non-mechanical components may be used to secure the RMC (445) (and the IHS (410)) to the FTA (460A) without departing from the scope of the invention.

Those skilled in the art will appreciate that while the first portion of the RMC (445) is shown as having two SHs (454A, 454B), the first portion of the RMC (445) may have more SHs without departing from the scope of the invention.

Further, a second portion of the RMC (445) includes a first set of holes (not shown) to be aligned with the first set of MHs (e.g., 275A, 275B, FIG. 2.2) located on a rack (420). The first set of holes allows a first set of bolts (450A, 450B) to pass through and interface with the first set of MHs (e.g., 275A, 275B, FIG. 2.2) located on the rack (420). When the first set of holes is aligned with the first set of MHs (e.g., 275A, 275B, FIG. 2.2) located on the rack (420), the first set of bolts (450A, 450B) is used to secure the rack (420) to the RMC (445) itself.

Those skilled in the art will appreciate that while the first set of bolts (450A, 450B) is used to secure the RMC (445) to the rack (420), any other mechanical or non-mechanical components may be used to secure the RMC (445) to the rack (420) without departing from the scope of the invention.

Those skilled in the art will appreciate that while the RMC (445) is shown as a bracket, the RMC (445) may be in another shape (while still providing the same functionalities) without departing from the scope of the invention.

In one or more embodiments, similar to the RMC (340B) discussed above in reference to FIG. 3.1, a second RMC (not shown), a second set of FT bolts (not shown), a second set of bolts (not shown), and a second set of slot nuts (not shown) are used to affix a rear side of the IHS (410) to the floor (440). Similar to the RMC (340B), the second RMC may include a first portion and a second portion. Details of the first portion and the second portion are described above in reference to FIG. 3.1.

In one or more embodiments, the RMCs (e.g., 445) may provide one or more functionalities to the IHS (410). For example, the RMCs (e.g., 445) may act as mechanical hard-stop components and may provide structural support to the IHS (410) in case of a seismic event. As yet another example, the RMCs (e.g., 445) may also provide structural support to the IHS (410) to keep the IHS (410) connected to the floor (440).

The aforementioned examples are not intended to limit the scope of the invention.

In one or more embodiments, in addition to being mechanical hard-stop components, the RMCs (e.g., 445) may act as air containment components, in which the RMCs (e.g., 445) may segregate cold air in a cold aisle from hot air in a hot aisle (or from other air in the MITC (e.g., 210, FIG. 2.1)). In this manner, the RMCs (e.g., 445) may (i) increase cooling efficiency of the MECC (e.g., 210, FIG. 2.1), (ii) reduce the amount of time of the MECC (e.g., 210, FIG. 2.1) needs to operate, (iii) reduce recirculation (e.g., mixing of hot air with cold air), (iv) bypass airflow from one aisle to another aisle, (v) improve usability and serviceability of the computing devices (e.g., 270, FIG. 2.2), (vi) enhance thermal management of the internal environment of the MITC (e.g., 220, FIG. 2.1), (vii) prevent damage to the hardware components of the computing devices (e.g., 270, FIG. 2.2), and (viii) improve functionality of the hardware components of the computing devices (e.g., 270, FIG. 2.2).

In one or more embodiments, both RMCs (RMC (445) and the second RMC) have the same size to affix the IHS (410) to the floor (440). As discussed above, without redesigning, the floor (440) has the functionality to host different types of IHSs with the help of the FTAs (460A, 460B). Assuming that the rack (420) is a "first size" rack, the RMCs (RMC (445) and the second RMC) may then be referred to as "first size" RMCs.

When a second IHS (not shown), which has a rack width greater than the rack width of the IHS (410), needs to be affixed to the floor (440), "second size" RMCs may need to be used because the second IHS includes a "second size" rack (e.g., a 800 mm wide rack). Similarly, when a third IHS (not shown), which has a rack width less than the rack width of the IHS (410), needs to be affixed to the floor (440), "third size" RMCs may need to be used because the third IHS includes a "third size" rack (e.g., a 600 mm wide rack).

In one or more embodiments, similar to the floor (320) discussed above in reference to FIG. 3.1, apart from hosting the IHSs (e.g., 410), the floor (440) may also host other components. Further, the floor (440) is affixed to a set of isolators (not shown), in which a top side of each isolator is affixed to a bottom side of the floor (440). Further, a bottom side of each isolator is affixed to the floor of the MITC (e.g., 352, FIG. 3.2).

Those skilled in the art will appreciate that while the details of the RMC (445), the IHS (410), and the FTAs (460A, 460B) are discussed above, those details also apply to other RMCs, IHSs, and FTAs disposed within the MITC (e.g., 220, FIG. 2.1) without departing from the scope of the invention.

In one or more embodiments, based on the aforementioned FTA designs, a customer may have a flexibility to affix different types of components to the floor without making any modifications to the floor. In this manner, for example, the customer may affix additional components to the floor over time without having any limitations on where to affix the components.

The aforementioned example is not intended to limit the scope of the invention.

The problems discussed throughout this application should be understood as being examples of problems solved by embodiments described herein, and the various embodiments should not be limited to solving the same/similar problems. The disclosed embodiments are broadly applicable to address a range of problems beyond those discussed herein.

While embodiments discussed herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A modular information technology component (MITC), comprising:
    an information handling system (IHS);
    a utility control component (UCC),
        wherein the UCC manages a temperature within the IHS and is configured to detect and suppress fire within the IHS,
        wherein the UCC is integrated within the MITC as a non-standalone component to support different types of IHSs;
    a floor, wherein the floor comprises a floor track apparatus (FTA) and the IHS is located on the floor; and
    a rack mounting component (RMC), wherein the RMC affixes the IHS to the FTA.

2. The MITC of claim 1, wherein the floor further comprises a second FTA,
    wherein the FTA is located on a first side of the floor,
    wherein the second FTA is located on a second side of the floor,
    wherein an orientation of the first side and an orientation of the second side are parallel to each other, and
    wherein the FTA and the second FTA are rails.

3. The MITC of claim 2,
    wherein the floor has a first portion, a second portion, and a third portion,
    wherein the second portion is elevated relative to the first portion and the third portion,
    wherein the IHS is located on the second portion, and
    wherein the FTA is located on the first portion and the second FTA is located in the third portion.

4. The MITC of claim 2,
    wherein the FTA extends along an entire first side of the floor, and
    wherein the second FTA extends along an entire second side of the floor.

5. The MITC of claim 2, wherein the floor is affixed to a set of isolators, wherein the set of isolators provides a shock isolation to the IHS.

6. The MITC of claim 2,
    wherein the FTA comprises a first set of mounting holes (MHs), wherein the first set of MHs is aligned along an entire first side of the floor, and wherein the second FTA comprises a second set of MHs, wherein the second set of MHs is aligned along an entire second side of the floor.

7. The MITC of claim 6,
wherein the RMC is a bracket, wherein the bracket comprises a first portion and a second portion,
wherein the first portion of the bracket is affixed to the first set of MHs, and wherein the second portion of the bracket is affixed to the IHS.

8. The MITC of claim 6, further comprising a second RMC,
wherein the second RMC is a second bracket, wherein the second bracket comprises a first portion and a second portion,
wherein the first portion of the second bracket is affixed to the second set of MHs, and
wherein the second portion of the second bracket is affixed to the IHS.

9. The MITC of claim 1, further comprising a second FTA and a second RMC,
wherein a length of the FTA is equal to a length of the second FTA, wherein the FTA and the second FTA are parallel to each other,
wherein the IHS is connected to the FTA via the RMC, wherein the IHS is connected to the second FTA via the second RMC, and
wherein the RMC and the second RMC are of a first size.

10. The MITC of claim 8, further comprising a second IHS, a third RMC, and a fourth RMC,
wherein a width of the second IHS is greater than a width of the IHS,
wherein the second IHS is connected to the FTA via the third RMC, wherein the second IHS is connected to the second FTA via the fourth RMC, and
wherein the third RMC and the fourth RMC are of a second size, wherein the first size and the second size are different.

11. The MITC of claim 1, wherein the IHS comprises a rack and a plurality of computing devices, wherein the rack is a housing for the plurality of computing devices.

12. The MITC of claim 1, wherein the floor further comprises a second FTA,
wherein the FTA is located on a first side of the floor,
wherein the second FTA is located on a second side of the floor,
wherein the first side and the second side are parallel to each other, and
wherein the FTA and the second FTA are grooves.

13. The MITC of claim 12,
wherein the FTA extends along an entire first side of the floor, and
wherein the second FTA extends along an entire second side of the floor.

14. The MITC of claim 12, wherein the floor is affixed to a set of isolators, wherein the set of isolators provides a shock isolation to the IHS.

15. The MITC of claim 12,
wherein the RMC is a bracket, wherein the bracket comprises a first portion and a second portion,
wherein the first portion of the bracket is affixed to the floor passing a bolt through a hole in the first portion of the bracket and connecting the bolt to a slot nut positioned inside the FTA, and
wherein the second portion of the bracket is affixed to the IHS.

16. The MITC of claim 12, further comprising a second RMC,
wherein the second RMC is a second bracket, wherein the second bracket comprises a first portion and a second portion,
wherein the first portion of the second bracket is affixed to the floor passing a bolt through a hole in the first portion of the second bracket and connecting the bolt to a slot nut positioned inside the second FTA, and
wherein the second portion of the second bracket is affixed to the IHS.

17. The MITC of claim 12, further comprising a second RMC,
wherein a length of the FTA is equal to a length of the second FTA, wherein the FTA and the second FTA are parallel to each other,
wherein the IHS is connected to the FTA via the RMC, wherein the IHS is connected to the second FTA via the second RMC, and
wherein the RMC and the second RMC are of a first size.

18. A modular data center, comprising:
a modular information technology component (MITC),
wherein the MITC comprises an information handling system (IHS), a utility control component (UCC), a floor, and a rack mounting component (RMC),
wherein the UCC manages a temperature within the IHS and is configured to detect and suppress fire within the IHS,
wherein the UCC is integrated within the MITC as a non-standalone component to support different types of IHSs,
wherein the floor comprises a floor track apparatus (FTA), wherein the RMC affixes the IHS to the FTA,
wherein the FTA is one selected from a group consisting of a rail and a groove; and
a modular environmental control component (MECC),
wherein the MECC comprises a plurality of environmental control components (ECCs) and built-in airflow connection components, wherein the built-in airflow connection components remove and supply air to the MITC.

19. The modular data center of claim 18, wherein the floor is affixed to a set of isolators, wherein the set of isolators provides a shock isolation to the IHS.

20. A modular data center, comprising:
a modular information technology component (MITC),
wherein the MITC comprises an information handling system (IHS), a utility control component (UCC), a floor, and a rack mounting component (RMC),
wherein the UCC manages a temperature within the IHS and is configured to detect and suppress fire within the IHS,
wherein the UCC is integrated within the MITC as a non-standalone component to support different types of IHSs,
wherein the floor comprises a floor track apparatus (FTA), wherein the RMC affixes the IHS to the FTA,
wherein the floor is affixed to a set of isolators, wherein the set of isolators provides a shock isolation to the IHS; and
a modular environmental control component (MECC),
wherein the MECC comprises a plurality of environmental control components (ECCs) and built-in airflow connection components, wherein the built-in airflow connection components remove and supply air to the MITC.

\* \* \* \* \*